(12) United States Patent
Sherpa et al.

(10) Patent No.: US 10,991,594 B2
(45) Date of Patent: *Apr. 27, 2021

(54) METHOD FOR AREA-SELECTIVE ETCHING OF SILICON NITRIDE LAYERS FOR THE MANUFACTURE OF MICROELECTRONIC WORKPIECES

(71) Applicant: Tokyo Electron Limited, Tokyo (JP)

(72) Inventors: Sonam D. Sherpa, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/447,609

(22) Filed: Jun. 20, 2019

(65) Prior Publication Data

US 2019/0393048 A1 Dec. 26, 2019

Related U.S. Application Data

(60) Provisional application No. 62/688,745, filed on Jun. 22, 2018.

(51) Int. Cl.
| | | |
|---|---|---|
| *H01L 21/311* | (2006.01) | |
| *H01L 21/02* | (2006.01) | |
| *H01L 29/16* | (2006.01) | |
| *H01L 21/768* | (2006.01) | |
| *H01L 21/033* | (2006.01) | |

(52) U.S. Cl.
CPC ...... *H01L 21/31116* (2013.01); *H01L 21/311* (2013.01); *H01L 21/0217* (2013.01); *H01L 21/76829* (2013.01); *H01L 29/16* (2013.01)

(58) Field of Classification Search
None
See application file for complete search history.

(56) References Cited

U.S. PATENT DOCUMENTS

| | | | | |
|---|---|---|---|---|
| 6,777,340 | B1* | 8/2004 | Chiu | H01L 21/3081 |
| | | | | 257/E21.232 |
| 2008/0156771 | A1* | 7/2008 | Jeon | H01J 37/3233 |
| | | | | 216/66 |
| 2016/0035581 | A1* | 2/2016 | Posseme | H01L 21/306 |
| | | | | 438/705 |
| 2018/0269070 | A1* | 9/2018 | Eason | H01J 37/32522 |

* cited by examiner

*Primary Examiner* — Stephanie P Duclair
(74) *Attorney, Agent, or Firm* — Rothwell, Figg, Ernst & Manbeck, P.C.

(57) ABSTRACT

Embodiments provide area-selective etching of silicon nitride for the manufacture of microelectronic workpieces through sequential exposure of silicon nitride layers to hydrogen ions/radicals followed by fluorine ions/radicals using beam delivery techniques such as ion beam and/or neutral beam techniques. The area-selective etch processes are anisotropic when hydrogen ions are used and are isotropic when hydrogen radicals are used. Further, sputtering of material onto a substrate for a microelectronic workpiece is not required for the disclosed embodiments. Further, by using ion beam and/or neutral beam techniques, area-selective etching of silicon nitride is achieved as opposed to the large-area etching provided by prior plasma processing techniques. For certain embodiments, the ion/neutral beam techniques described herein are used to fabricate silicon nitride hard masks without requiring the use of any mask.

21 Claims, 10 Drawing Sheets

METHOD FOR AREA-SELECTIVE ETCHING OF SILICON NITRIDE LAYERS FOR THE MANUFACTURE OF MICROELECTRONIC WORKPIECES

RELATED APPLICATIONS

This application claims priority to the following provisional application: U.S. Provisional Patent Application Ser. No. 62/688,745, filed Jun. 22, 2018, and entitled "METHOD FOR AREA-SELECTIVE ETCHING OF SILICON NITRIDE LAYERS FOR THE MANUFACTURE OF MICROELECTRONIC WORKPIECES," which is hereby incorporated by reference in its entirety.

BACKGROUND

The present disclosure relates to methods for the manufacture of microelectronic workpieces, and in particular, methods to etch material layers on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Optical lithography reached an inflection point at 22 nm (nanometer) technology nodes as conventional approaches to scaling down the critical dimension (CD) or pitch of patterned features using resolution enhancement techniques (RETs) met its physical limit. Self-aligned multiple patterning has been used in high-volume manufacturing for sub-22 nm technology nodes. In addition, next-generation lithography techniques such as extreme ultraviolet (EUV) lithography, directed self-assembly (DSA), imprint lithography, and maskless lithography (e.g., electron beam (E-beam) direct write) are being developed. Maskless lithography, such as E-beam direct write lithography, represents a significant departure from the constraints of traditional optical lithography. Feasibility of E-beam lithography, however, is limited by low throughput and still requires a resist for patterning. As such, high throughput manufacturing of microelectronic workpieces is difficult to achieve using E-beam lithography techniques. In contrast, ion-beam lithography has higher throughput and does not require resist for patterning. However, this ion-beam technique typically sputters material in order to create desired patterning, and re-deposition of the sputtered material can cause undesirable micro-masking effects that degrade devices formed on the microelectronic workpieces.

SUMMARY

Embodiments are described herein that provide area-selective etching of silicon nitride for the manufacture of microelectronic workpieces. The disclosed embodiments provide sequential exposure of silicon nitride layers to hydrogen ions/radicals followed by fluorine ions/radicals using beam delivery techniques such as ion beam and/or neutral beam techniques. The area-selective etch processes described herein are anisotropic when hydrogen ions are used and are isotropic when hydrogen radicals are used. Further, sputtering of material onto a substrate for a microelectronic workpiece is not required for the disclosed embodiments. Further, by using ion beam and/or neutral beam techniques, area-selective etching of silicon nitride is achieved as opposed to the large-area etching provided by prior plasma processing techniques. For certain embodiments, the ion/neutral beam techniques described herein are used to fabricate silicon nitride hard masks without requiring the use of any mask. Different or additional features, variations, and embodiments can also be implemented, and related systems and methods can be utilized as well.

For one embodiment, a method of processing microelectronic workpieces including delivering a substrate for a microelectronic workpiece into a plasma processing chamber, sequentially exposing a silicon nitride layer formed on the substrate to hydrogen plasma and fluorine plasma using one or more beams to remove selected regions of the silicon nitride layer, and removing the substrate form the plasma processing chamber.

In additional embodiments, the sequentially exposing of the silicon nitride layer is performed to pattern the silicon nitride layer. If further embodiments, the patterned silicon nitride layer is used as a hard mask in one or more subsequent processing steps prior to the removing.

In additional embodiments, the sequentially exposing is repeated to apply a desired amount of etching to the selected regions of the silicon nitride layer.

In additional embodiments, the method includes using a first plasma gas to generate the hydrogen plasma and using a second plasma gas to generate the fluorine plasma. In further embodiments, the first plasma gas includes hydrogen ($H_2$). In still further embodiments, the first plasma gas further includes argon (Ar). In further embodiments, the second plasma gas includes oxygen ($O_2$) and nitrogen trifluoride ($NF_3$). In still further embodiments, the ratio of $O_2$ to $NF_3$ is at least one of a ratio greater than four such that $O_2/NF_3>4$ or a ratio between 2 and 5 such that $2 \leq O_2/NF_3 \leq 5$. In still further embodiments, the first plasma gas further includes argon (Ar).

In additional embodiments, the sequentially exposing includes igniting a first plasma gas within a processing chamber to generate a first plasma including hydrogen ions, delivering the hydrogen ions in one or more beams to the silicon nitride layer to form modified silicon nitride, igniting a second plasma gas within the processing chamber to generate a second plasma including fluorine ions, and delivering the second plasma to the silicon nitride layer to remove the modified silicon nitride.

In additional embodiments, the sequentially exposing includes igniting a first plasma gas within a processing chamber to generate a first plasma including hydrogen ions, delivering the hydrogen ions to the silicon nitride layer to form modified silicon nitride, igniting a second plasma gas within the processing chamber to generate a second plasma including fluorine ions, and delivering the fluorine ions in one or more neutral beams to the silicon nitride layer to remove the modified silicon nitride. In further embodiments, the method further includes passing the fluorine ions through a grid to form the one or more neutral beams.

In additional embodiments, the sequentially exposing includes igniting a first plasma gas within a processing chamber to generate a first plasma including hydrogen ions, delivering the hydrogen ions in one or more beams to the silicon nitride layer to form modified silicon nitride, igniting a second plasma gas within the processing chamber to generate a second plasma including fluorine ions, and delivering the fluorine ions in one or more neutral beams to the silicon nitride layer to remove the modified silicon nitride.

In further embodiments, the method further includes passing the fluorine ions through a grid to form the one or more neutral beams.

In additional embodiments, the sequentially exposing includes igniting a first plasma gas within a processing chamber to generate a first plasma including hydrogen ions, delivering the hydrogen ions in one or more neutral beams to the silicon nitride layer to form modified silicon nitride, igniting a second plasma gas within the processing chamber to generate a second plasma including fluorine ions, and delivering the fluorine ions in one or more neutral beams to the silicon nitride layer to remove the modified silicon nitride. In further embodiments, the method further includes passing the hydrogen ions through a grid to form the one or more neutral beams and passing the fluorine ions through a grid to form the one or more neutral beams.

In additional embodiments, the substrate also includes at least one of a silicon layer or a silicon oxide layer. In further embodiments, the hydrogen plasma includes hydrogen ions to provide anisotropic etching of the silicon nitride layer. In further embodiments, the hydrogen plasma includes hydrogen radicals to provide isotropic etching of the silicon nitride layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, an area-selective etch of a silicon nitride layer is provided for the manufacture of microelectronic workpieces. The disclosed embodiments sequentially expose silicon nitride layers to hydrogen ions/radicals followed by fluorine ions/radicals using ion beam and/or neutral beam delivery techniques. By using ion beam and/or neutral beam techniques, area-selective etching of silicon nitride is achieved. Other advantages can also be achieved while still taking advantage of the process techniques described herein.

Figure 1A:
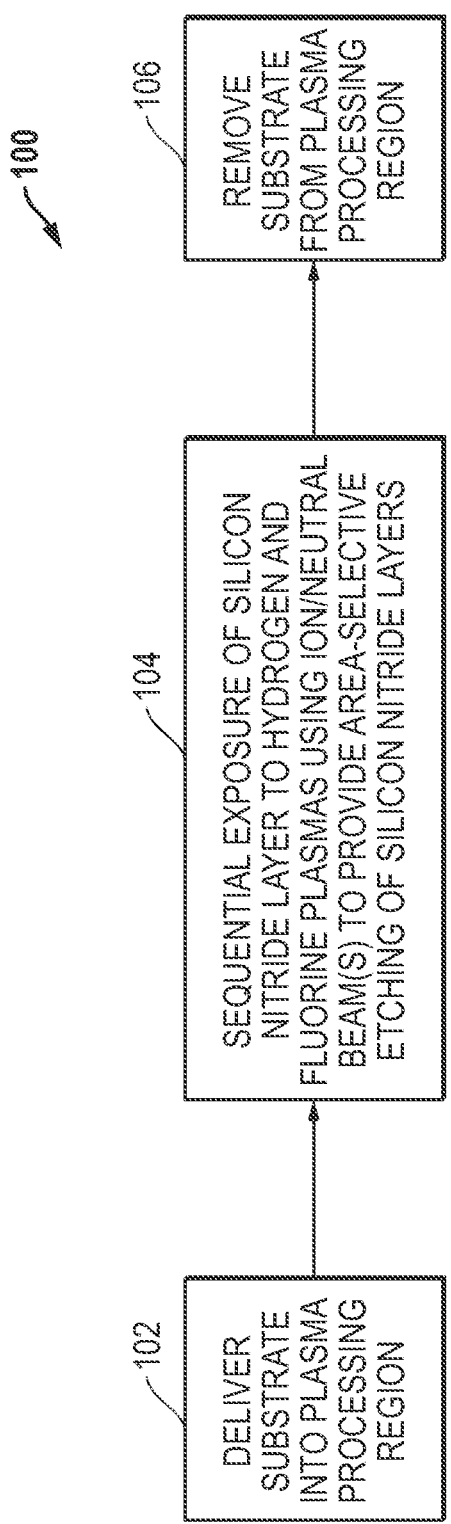
FIG. 1A is a process flow diagram of an example embodiment where an area-selective etch is performed on a silicon nitride layer.

FIG. 1A is a process flow diagram of an example embodiment 100 where an area-selective etch is performed on a silicon nitride layer. In block 102, a substrate is delivered into a plasma processing region. In block 104, sequential exposure of a silicon nitride layer to hydrogen and fluorine plasmas is performed using ion and/or neutral beams to provide area-selective etch of the silicon nitride layer. Additional example embodiments for this area-selective etch are described further below. As described herein, the sequential exposure can be repeated until a desired amount of silicon nitride has been etched. In block 106, the substrate is removed from the plasma processing region. It is noted that one or more additional process steps can be included with respect to embodiment 100 before and/or after sequential exposure provided in block 104. It is also noted that the plasma processing region can be, for example, a plasma processing chamber. It is further noted that the silicon nitride layer can be implemented as silicon nitride (SiN) or a silicon nitride material that includes SiN along with one or more other elements. Other variations can also be implemented while still taking advantage of the techniques described herein.

Figure 1B:
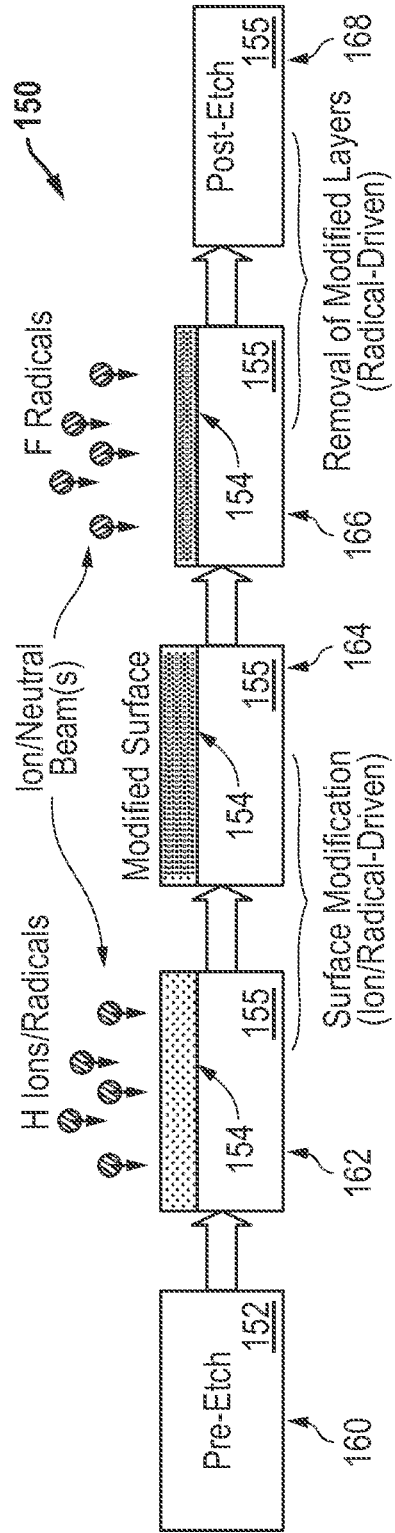
FIG. 1B is a diagram of an example embodiment for modifications made to a silicon nitride layer during the example sequential exposure process used to implement the area-selective etch described in FIG. 1A.

FIG. 1B is a diagram of an example embodiment 150 for modifications made to a silicon nitride layer 152 during the example sequential exposure process used to implement the area-selective etch described in FIG. 1A. For pre-etch as represented by view 160, the silicon nitride layer 152 has been exposed on the surface of a substrate for a microelectronic workpiece. For the first process step (Step 1) as represented by view 162, a plasma gas is introduced and ignited under sufficient conditions to form hydrogen (H) ions or radicals that modify the surface for the silicon nitride layer 152 within a selected region 154 to form modified silicon nitride. After the first process step has completed and as represented by view 164, this radical-driven or ion-driven surface modification of the silicon nitride layer 152 leaves the modified region 154 and the non-modified region 155. It is noted that the surface modification to the silicon nitride layers during this first process step (Step 1) causes increase in reactivity of silicon nitride toward fluorine radicals.

For the second process step (Step 2) as represented by view 166, a plasma gas is introduced and ignited under sufficient conditions to form fluorine (F) ions or radicals that remove the modified silicon nitride within the modified region 154. After this process step has completed as represented by post-etch view 168, this removal of the modified silicon nitride layer within the modified region 154 leaves only the silicon nitride within the non-modified region 155. It is further noted that the first and second process steps can be repeated to remove selectively any desired amount of the silicon nitride layer 152 through sequential modification and removal steps.

As described herein, the hydrogen ion/radicals and/or the fluorine ion/radicals are delivered to the surface of the silicon nitride layer using one or more ion beam or neutral beam techniques. This use of ion/neutral beams allows for area-selective etching of the silicon nitride layer as described in more detail below. For one example embodiment, plasma processing equipment is used that allows a plasma gas to be injected into a processing chamber and ignited for delivery of ions or neutral particles to a substrate. This plasma processing equipment can form ion beams and can use grids to generate neutral beams. In addition, the plasma processing equipment allows for a selected pressure (P) and temperature (T) to be applied within the processing chamber, for a selected microwave (MW) energy to be applied to the processing chamber, for a selected radio frequency (RF) energy to be applied to the processing chamber, and for a duration of the plasma processing steps to be controlled.

It is noted that ion beams can be formed, for example, by extracting energetic ions from a plasma source It is further noted that neutral beams can be formed, for example, by: extracting energetic ions from a plasma source and then neutralizing the ions by charge-exchange collisions with background neutrals or by glancing angle collision with a surface.

For one example embodiment, process parameters are set forth in the TABLE below. It is noted that the pressure is mTorr (mT); the temperature is degrees Celsius (C); and the duration is seconds (sec). It is also noted that $O_2$ to $NF_3$ gas ratio (*/*) is preferably greater than four such that $O_2/NF_3 > 4$. The $O_2$ to $NF_3$ gas ratio (*/*) in other preferred embodiments is within a range from 2 to 5 such that $2 \leq O_2/NF_3 \leq 5$. Other variations and processing parameters may also be used while still taking advantage of the techniques described herein.

TABLE

EXAMPLE PLASMA PROCESS PARAMETERS

| Step | Gas | Gas Ratio | P | T | RF | Duration |
|---|---|---|---|---|---|---|
| Step 1 | $H_2$, Ar | 700$H_2$/ 800Ar | 500 mT | 15 C. | 15-100 W | 5-60 sec |
| Step 1 | $H_2$, Ar | 225 $H_2$ | 5 mT | 15 C. | 25-100 W | 5-60 sec |
| Step 2 | $NF_3$, $O_2$, Ar | ***$O_2$/ ***$NF_3$/ 1000Ar | 500 mT | 15 C. | 15-100 W | 5-60 sec |

Figure 2A:
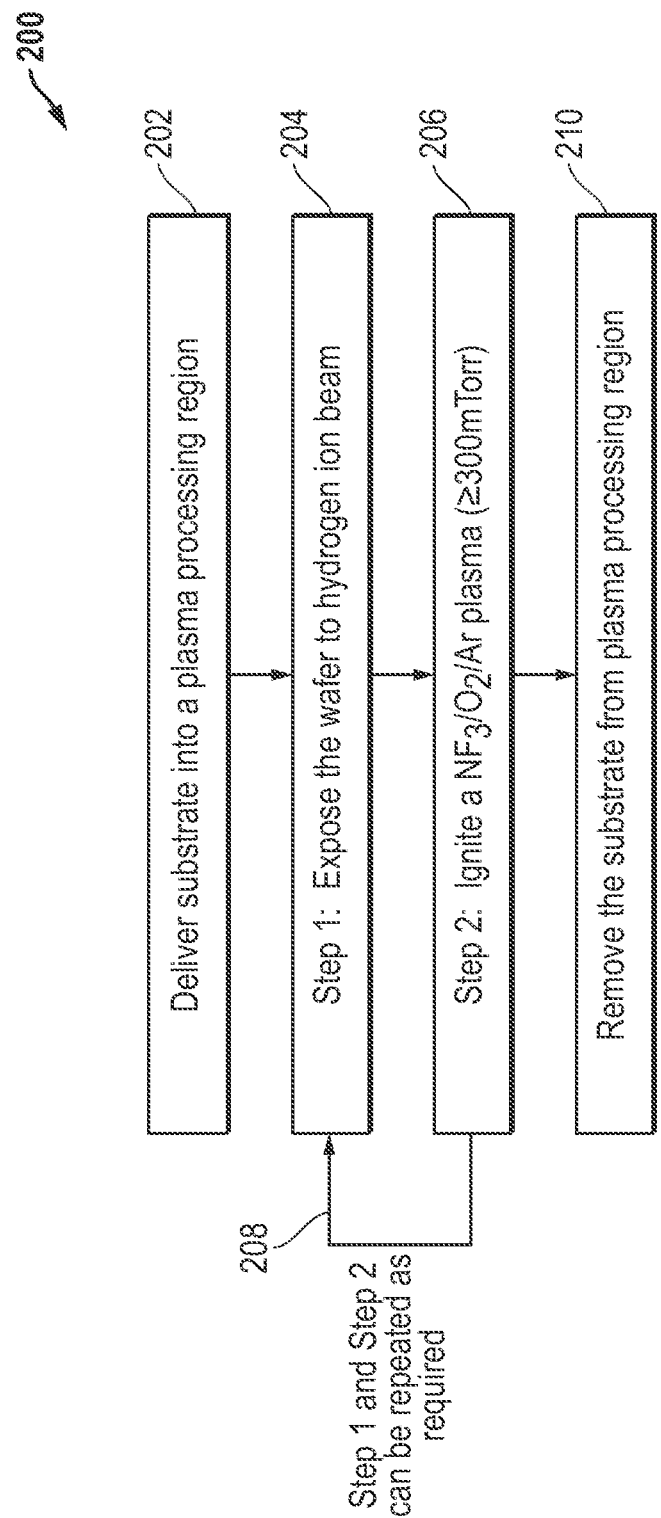
FIG. 2A is a process flow diagram of an example embodiment where an area-selective etch is performed on a silicon nitride layer using a hydrogen ion beam.

FIG. 2A is a process flow diagram of an example embodiment 200 where an area-selective etch is performed on a silicon nitride layer using a hydrogen ion beam. In block 202, a substrate for a microelectronic workpiece is delivered into a plasma processing region. In block 204, a first process step is performed (Step 1) using a hydrogen ion beam. For this first process step, a plasma gas including $H_2$ is flowed into the processing region, ignited, and controlled to form one or more hydrogen beams. As described herein, hydrogen ions within the plasma cause a surface modification to silicon nitride layer to form modified silicon nitride. The plasma processing for this first process step is then stopped, and the processing region is evacuated to remove the plasma gas. In block 206, a second process step is performed (Step 2). For this second process step, a plasma gas including fluorine (e.g., $NF_3$, $O_2$, and Ar) is flowed into the plasma processing region and ignited to form fluorine ions. For certain embodiments, a pressure sufficient to cause fluorine radicals to be formed from the plasma gas chemistry is the also applied within the processing region. For example, a pressure of 300 mTorr or more can be applied within the processing region. As described herein, the fluorine ions or radicals within the plasma cause the modified silicon nitride to be etched with respect to underlying layers, such as silicon and silicon oxide. The plasma processing for this second process step is then stopped, and the processing region is evacuated to remove the plasma gas. As indicated by arrow 208, the first process step (Step 1) of block 204 and the second process step (Step 2) of block 206 can be repeated to remove a desired amount of silicon nitride. After this has occurred, block 210 is reached where the substrate is removed from the plasma processing region.

Figure 2B:
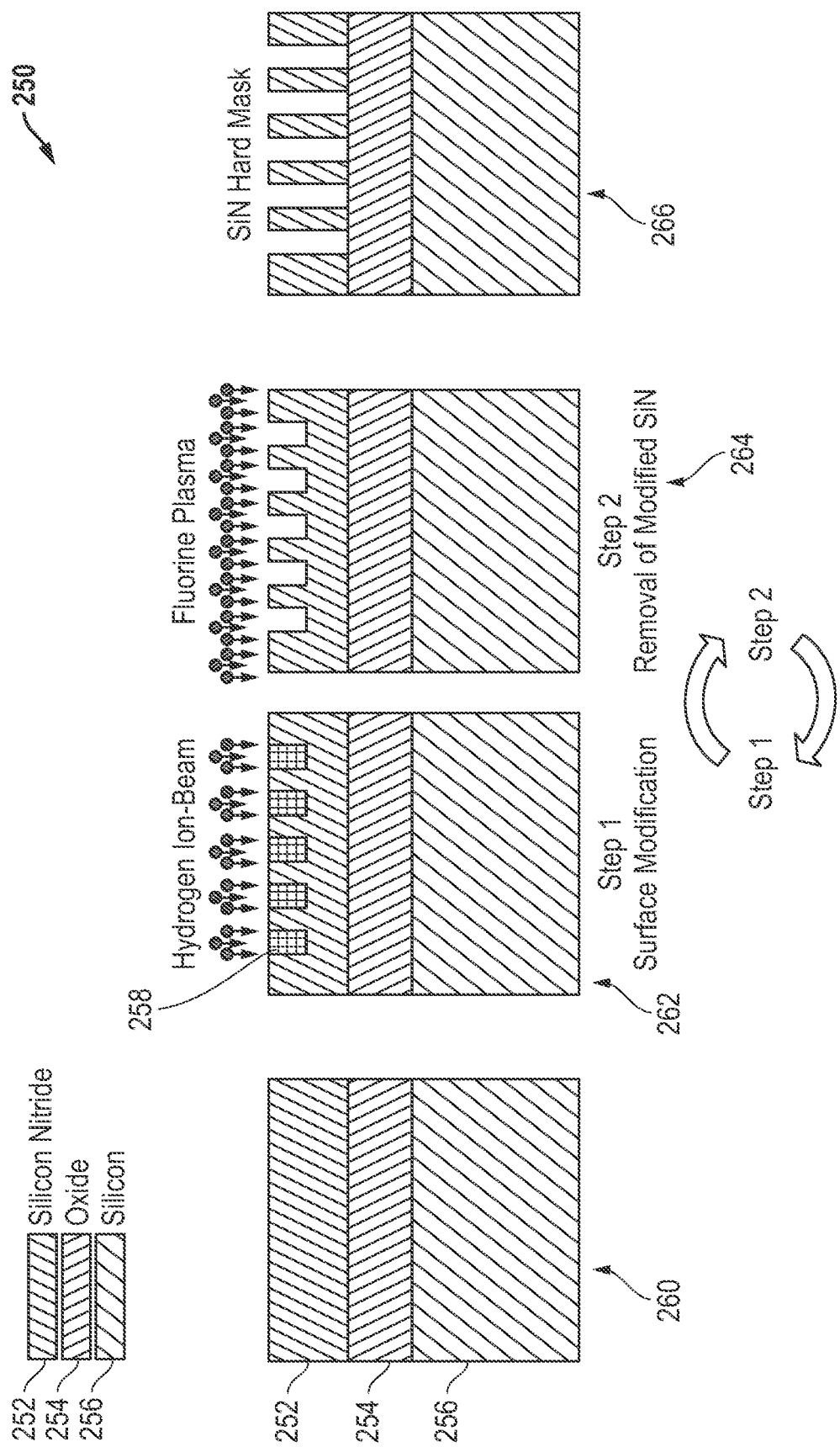
FIG. 2B is a diagram of an example embodiment for modifications made to a silicon nitride layer during the example process steps used to implement the area-selective etch described in FIG. 2A.

FIG. 2B is a diagram of an example embodiment 250 for modifications made to a silicon nitride layer 252 during the example process steps used to implement the area-selective etch described in FIG. 2A. For pre-etch as represented by view 260, a silicon nitride layer 252 is formed over a silicon oxide layer 254 and a silicon layer 256 on the surface of a substrate for a microelectronic workpiece. For the first process step (Step 1) as represented by view 262, a plasma gas is introduced, ignited, and controlled under sufficient conditions to form hydrogen (H) ions that are delivered in one or more ion beams to modify selected silicon nitride regions 258 of the surface for the silicon nitride layer 252. For the second process step (Step 2) as represented by view 264, a plasma gas is introduced, ignited, and controlled under sufficient conditions to form fluorine (F) ions or radicals that remove the modified silicon nitride regions 258. The first and second process steps can be repeated to remove a desired amount of the silicon nitride layer 252 within selected regions that are subjected to the hydrogen ion beams. After the process steps have completed as represented by post-etch view 266, a portion of the silicon nitride layer is left, and this patterned silicon nitride layer can provide a patterned hard mask for future processing.

Figure 3A:
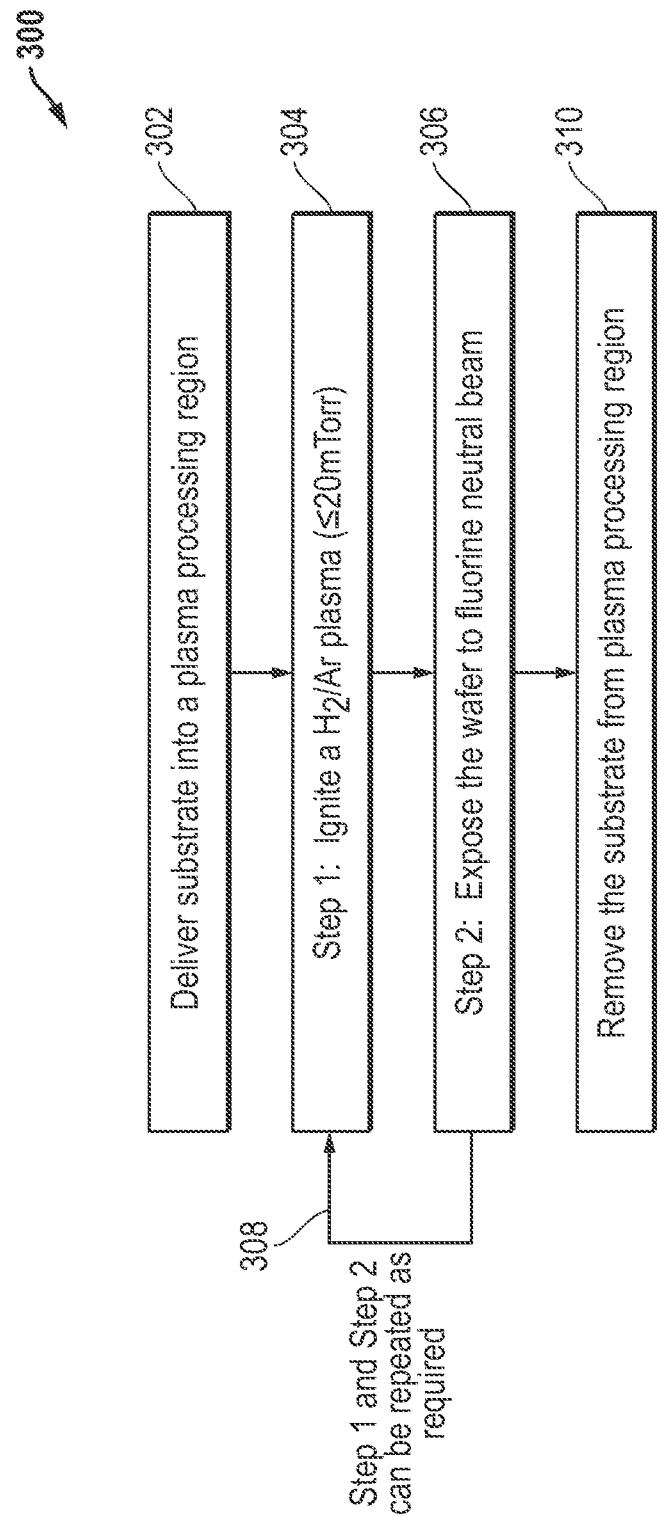
FIG. 3A is a process flow diagram of an example embodiment where an area-selective etch is performed on a silicon nitride layer using a hydrogen plasma and a fluorine neutral beam.

FIG. 3A is a process flow diagram of an example embodiment 300 where an area-selective etch is performed on a silicon nitride layer using a hydrogen plasma and a fluorine neutral beam. In block 302, a substrate for a microelectronic workpiece is delivered into a plasma processing region. In block 304, a first process step is performed (Step 1) using a hydrogen plasma. For this first process step, a plasma gas including hydrogen ($H_2$) and argon (Ar) is flowed into the processing region, ignited, and controlled to form a plasma containing hydrogen ions or radicals. For one embodiment, the pressure is 20 mTorr or less. As described herein, hydrogen ions or radicals within the plasma cause a surface modification to silicon nitride layers. The plasma processing for this first process step is then stopped, and the processing region is evacuated to remove the plasma gas. In block 306, a second process step is performed (Step 2). For this second process step, a plasma gas including fluorine is flowed into the processing region, ignited, and controlled to form fluorine neutral beams that are directed to selected regions of the silicon nitride layer. For example, fluorine ions can be generated and delivered to a grid that neutralizes the ions prior to delivery as fluorine neutral beams to the selected regions of the silicon nitride on the substrate. As described herein, the fluorine neutral beams cause the modified silicon nitride layers to be selectively etched with respect to underlying layers, such as silicon and silicon oxide. The plasma processing for this second process step is then stopped, and the processing region is evacuated to remove the plasma gas. As indicated by arrow 308, the first process step (Step 1) of block 304 and the second process step (Step 2) of block 306 can be repeated to remove a desired amount of silicon nitride. After this has occurred, block 310 is reached where the substrate is removed from the plasma processing region.

Figure 3B:
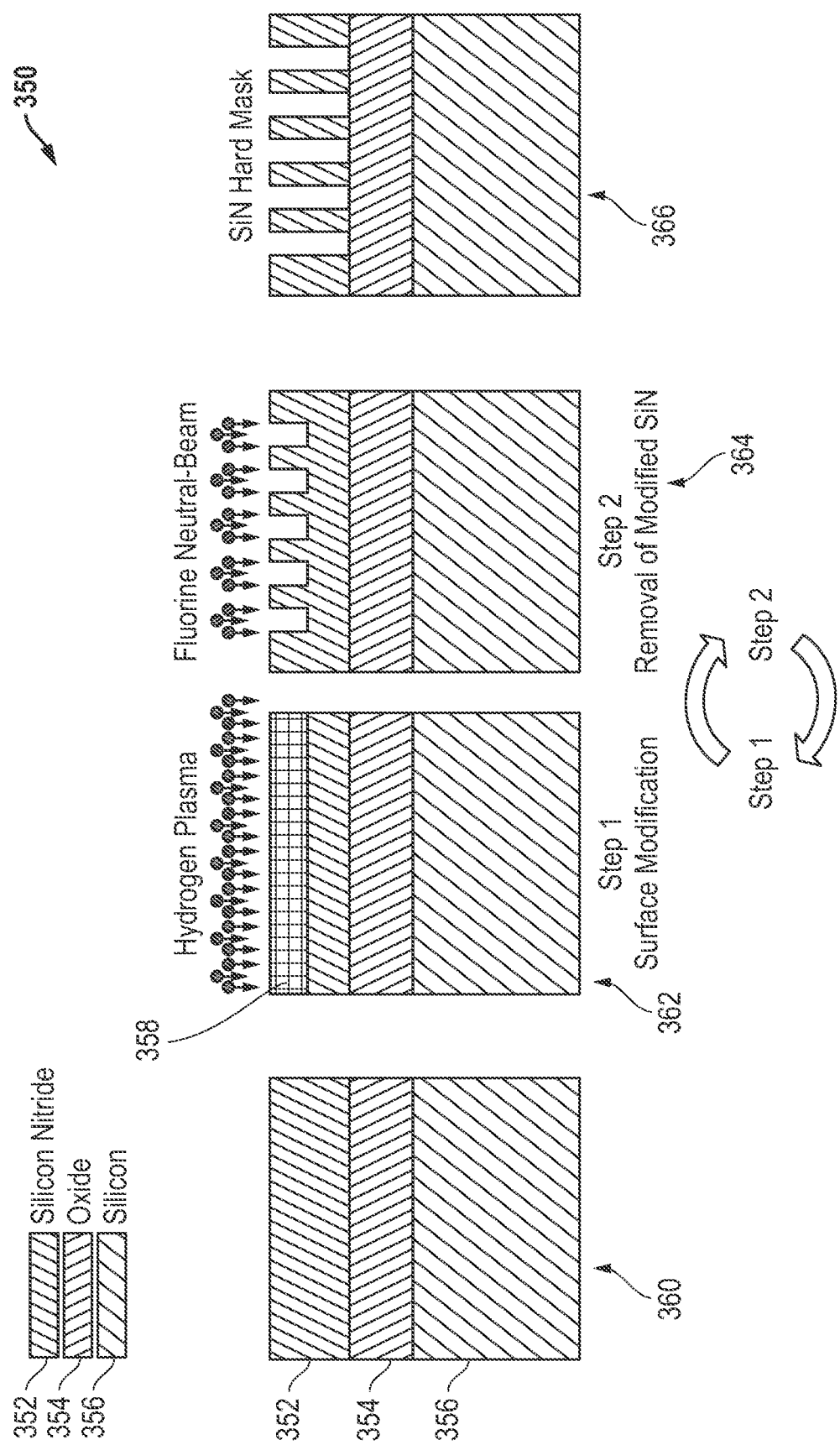
FIG. 3B is a diagram of an example embodiment for modifications made to a silicon nitride layer during the example process steps used to implement the area-selective etch described in FIG. 3A.

FIG. 3B is a diagram of an example embodiment 350 for modifications made to a silicon nitride layer 352 during the example process steps used to implement the area-selective etch described in FIG. 3A. For pre-etch as represented by view 360, a silicon nitride layer 352 is formed over a silicon oxide layer 354 and a silicon layer 356 on the surface of a substrate for a microelectronic workpiece. For the first process step (Step 1) as represented by view 362, a plasma gas is introduced, ignited, and controlled under sufficient conditions to form a hydrogen plasma that modifies a portion 358 of the surface for the silicon nitride layer 352. For the second process step (Step 2) as represented by view 364, a plasma gas is introduced, ignited, and controlled under sufficient conditions to form fluorine (F) neutral beams that remove the portion 358 of modified silicon nitride with respect to selected regions. The first and second process steps can be repeated to remove any desired amount of the silicon nitride layer 352 within selected regions. After the process steps have completed as represented by post-etch view 366, a portion of the silicon nitride layer is left, and this patterned silicon nitride layer can provide a patterned hard mask for future processing.

Figure 4A:
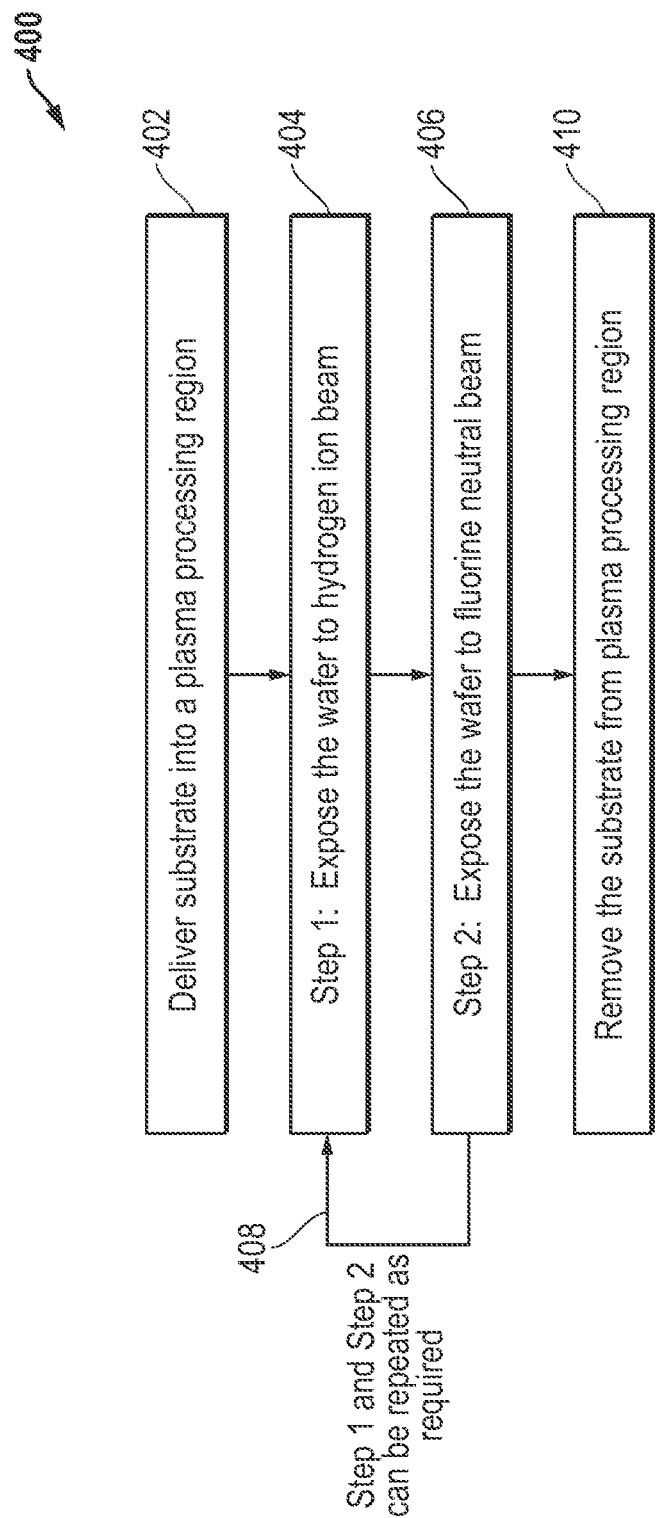
FIG. 4A is a process flow diagram of an example embodiment where an area-selective etch is performed on a silicon nitride layer using a hydrogen ion beam and a fluorine neutral beam.

FIG. 4A is a process flow diagram of an example embodiment 400 where an area-selective etch is performed on a silicon nitride layer using a hydrogen ion beam and a fluorine neutral beam. In block 402, a substrate for a microelectronic workpiece is delivered into a plasma processing region. In block 404, a first process step is performed (Step 1) using a hydrogen ion beam. For this first process step, a plasma gas including $H_2$ is flowed into the processing region, ignited, and controlled to form one or more hydrogen beams. As described herein, hydrogen ions within the plasma cause a surface modification to silicon nitride layers. The plasma processing for this first process step is then stopped, and the processing region is evacuated to remove the plasma gas. In block 406, a second process step is performed (Step 2). For this second process step, a plasma gas including fluorine is flowed into the processing region, ignited, and controlled to form fluorine neutral beams that are directed to selected regions of the silicon nitride layer. For example, fluorine ions can be generated and delivered to a grid that neutralizes the ions prior to delivery as one or more fluorine neutral beams to the selected regions of the silicon nitride on the substrate. As described herein, the fluorine neutral beams cause the modified silicon nitride layers to be selectively etched with respect to underlying layers, such as silicon and silicon oxide. The plasma processing for this second process step is then stopped, and the processing region is evacuated to remove the plasma gas. As indicated by arrow 408, the first process step (Step 1) of block 404 and the second process step (Step 2) of block 406 can be repeated to remove a desired amount of silicon nitride. After this has occurred, block 410 is reached where the substrate is removed from the plasma processing region.

Figure 4B:
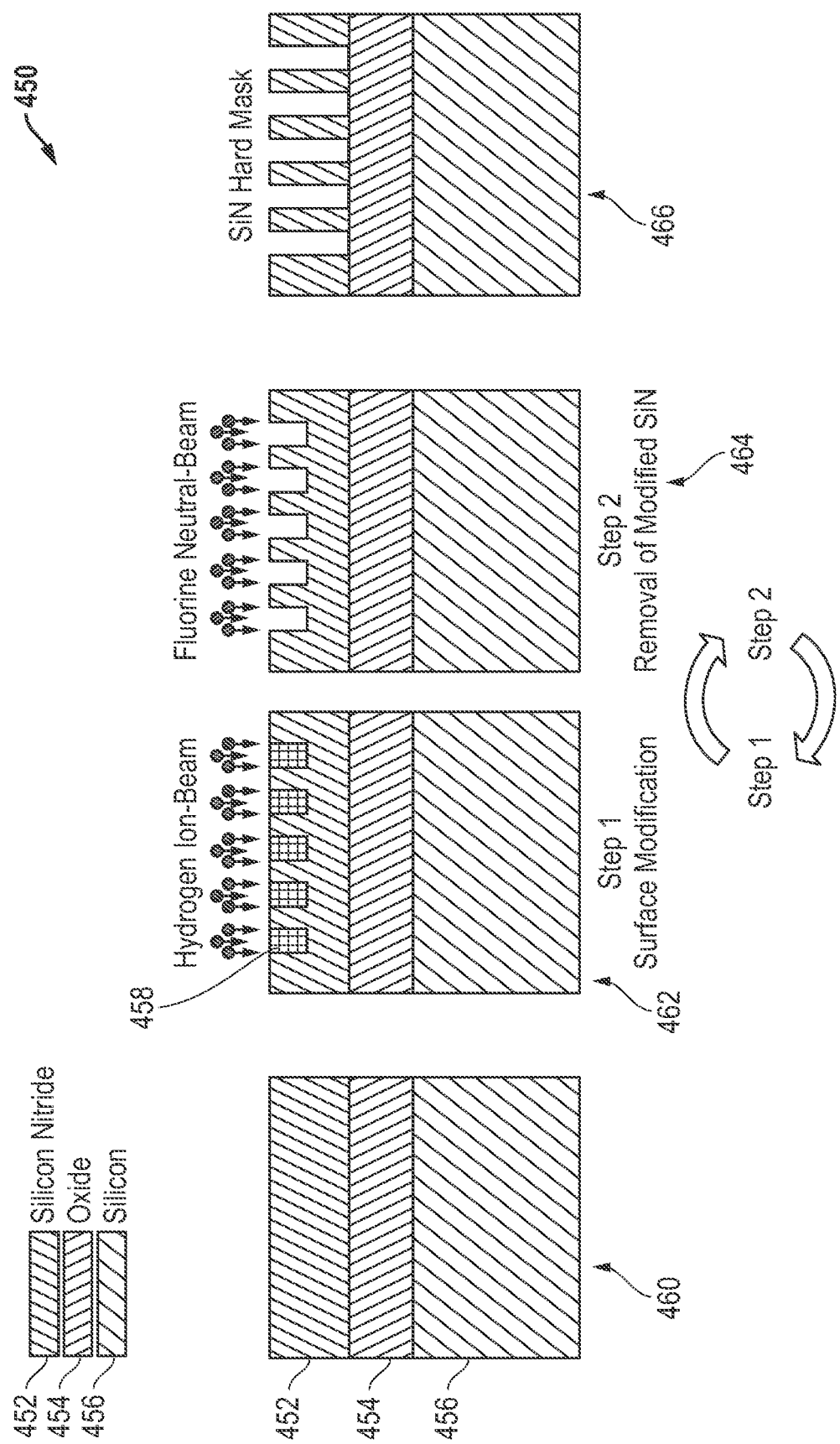
FIG. 4B is a diagram of an example embodiment for modifications made to a silicon nitride layer during the example process steps used to implement the area-selective etch described in FIG. 4A.

FIG. 4B is a diagram of an example embodiment 450 for modifications made to a silicon nitride layer 452 during the example process steps used to implement the area-selective etch described in FIG. 4A. For pre-etch as represented by view 460, a silicon nitride layer 452 is formed over a silicon oxide layer 454 and a silicon layer 456 on the surface of a substrate for a microelectronic workpiece. For the first process step (Step 1) as represented by view 462, a plasma gas is introduced, ignited, and controlled under sufficient conditions to form hydrogen (H) ion beams that modify selected regions 458 of the surface for the silicon nitride layer 452. For the second process step (Step 2) as represented by view 464, a plasma gas is introduced, ignited, and controlled under sufficient conditions to form fluorine (F) neutral beams that remove the modified silicon nitride 458 with respect to the selected regions 458. The first and second process steps can be repeated to remove any desired amount of the silicon nitride layer 452 within selected regions that are subjected to the hydrogen ion beams. After the process steps have completed as represented by post-etch view 466, a portion of the silicon nitride layer is left, and this patterned silicon nitride layer can provide a patterned hard mask for future processing.

Figure 5A:
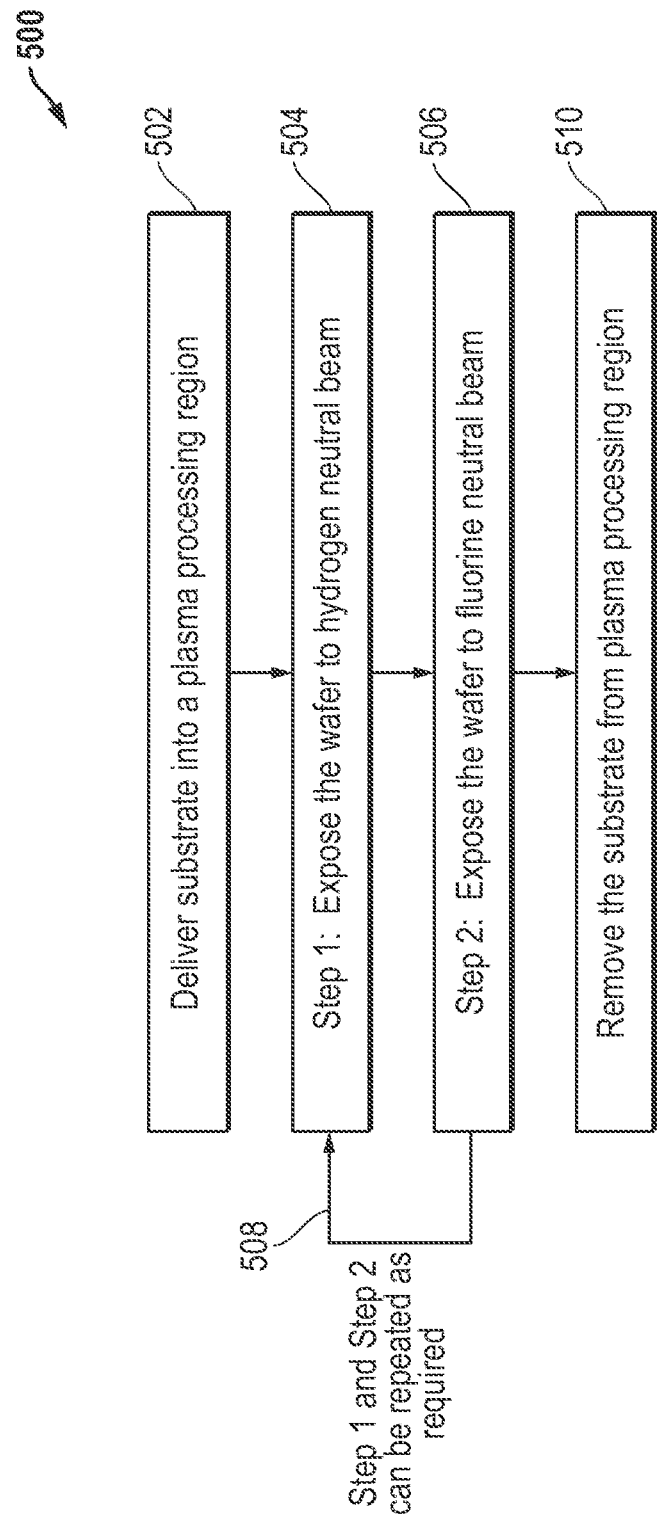
FIG. 5A is a process flow diagram of an example embodiment where an area-selective etch is performed on a silicon nitride layer using a hydrogen neutral beam and a fluorine neutral beam.

FIG. 5A is a process flow diagram of an example embodiment 500 where an area-selective etch is performed on a silicon nitride layer using a hydrogen neutral beam and a fluorine neutral beam. In block 502, a substrate for a microelectronic workpiece is delivered into a plasma processing region. In block 504, a first process step is performed (Step 1) using a hydrogen neutral beam. For this first process step, a plasma gas including hydrogen ($H_2$) is flowed into the processing region, ignited, and controlled to form one or more hydrogen neutral beams. For example, hydrogen ions can be generated and delivered to a grid that neutralizes the ions prior to delivery as one or more neutral beams to selected regions of the silicon nitride on the substrate. As described herein, hydrogen ion beams cause a surface modification to silicon nitride layers. The plasma processing for this first process step is then stopped, and the processing region is evacuated to remove the plasma gas. In block 506, a second process step is performed (Step 2). For this second process step, a plasma gas including fluorine is flowed into the processing region, ignited, and controlled to form fluorine neutral beams that are directed to selected regions of the silicon nitride layer. For example, fluorine ions can be generated and delivered as one or more neutral beams to a grid that neutralizes the ions prior to delivery to the selected regions of the silicon nitride on the substrate. As described herein, the fluorine neutral beams cause the modified silicon nitride layers to be selectively etched with respect to underlying layers, such as silicon and silicon oxide. The plasma processing for this second process step is then stopped, and the processing region is evacuated to remove the plasma gas. As indicated by arrow 508, the first process step (Step 1) of block 504 and the second process step (Step 2) of block 506 can be repeated, as required, to remove a desired amount of silicon nitride. After this has occurred, block 510 is reached where the substrate is removed from the plasma processing region.

Figure 5B:
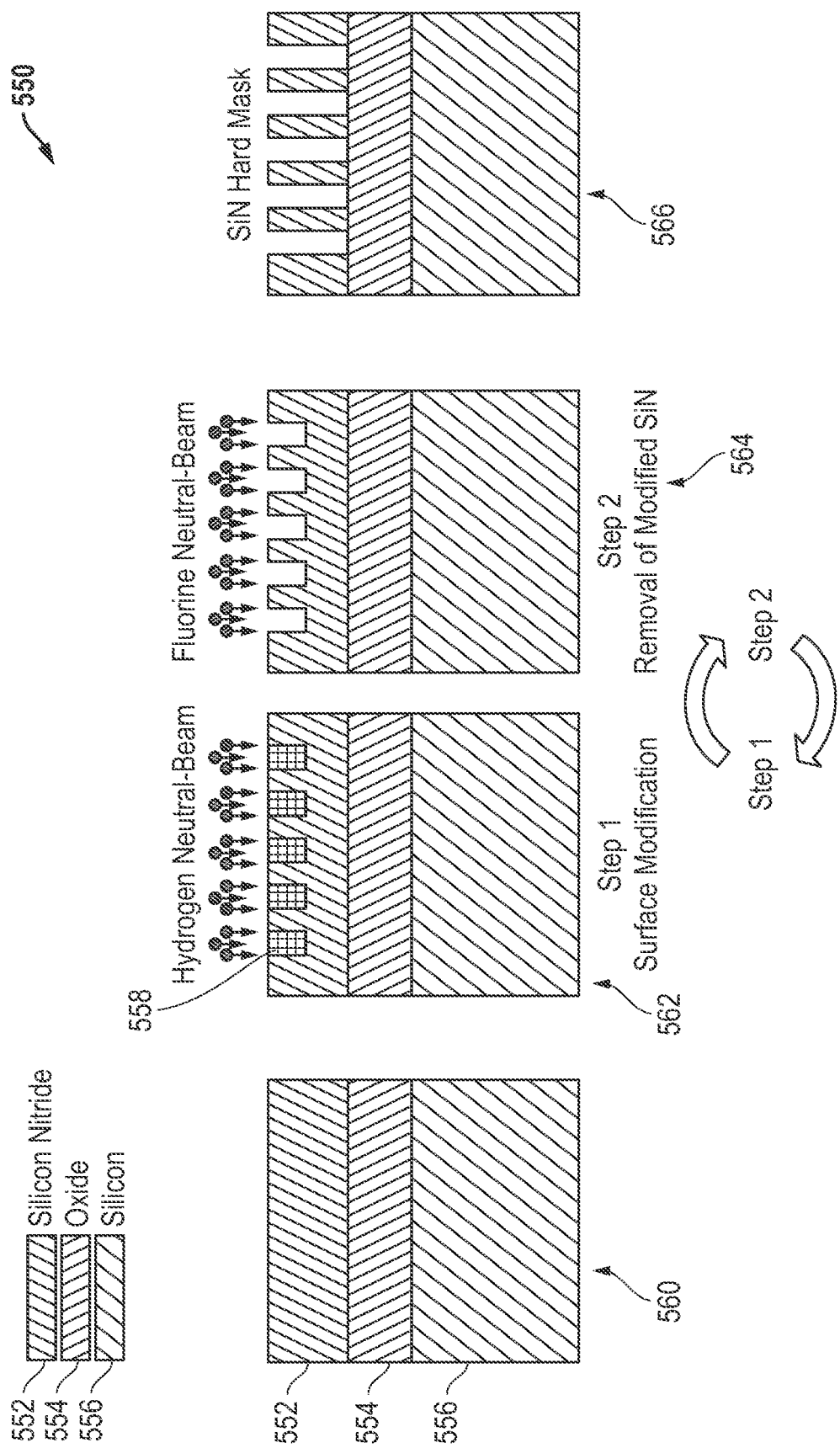
FIG. 5B is a diagram of an example embodiment for modifications made to a silicon nitride layer during the example process steps used to implement the area-selective etch described in FIG. 5A.

FIG. 5B is a diagram of an example embodiment 550 for modifications made to a silicon nitride layer 552 during the example process steps used to implement the area-selective etch described in FIG. 5A. For pre-etch as represented by view 560, a silicon nitride layer 552 is formed over a silicon oxide layer 554 and a silicon layer 556 on the surface of a substrate for a microelectronic workpiece. For the first process step (Step 1) as represented by view 562, a plasma gas is introduced, ignited, and controlled under sufficient conditions to form hydrogen (H) neutral beams that modify selected regions 558 of the surface for the silicon nitride layer 552. For the second process step (Step 2) as represented by view 564, a plasma gas is introduced, ignited, and controlled under sufficient conditions to form fluorine (F) neutral beams that remove the modified silicon nitride 558 with respect to the selected regions 558. The first and second process steps can be repeated to remove any desired amount of the silicon nitride layer 552 within selected regions that are subjected to the hydrogen ion beams. After the process steps have completed as represented by post-etch view 566, a portion of the silicon nitride layer is left, and this patterned silicon nitride layer can provide a patterned hard mask for future processing.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

Figure 6:
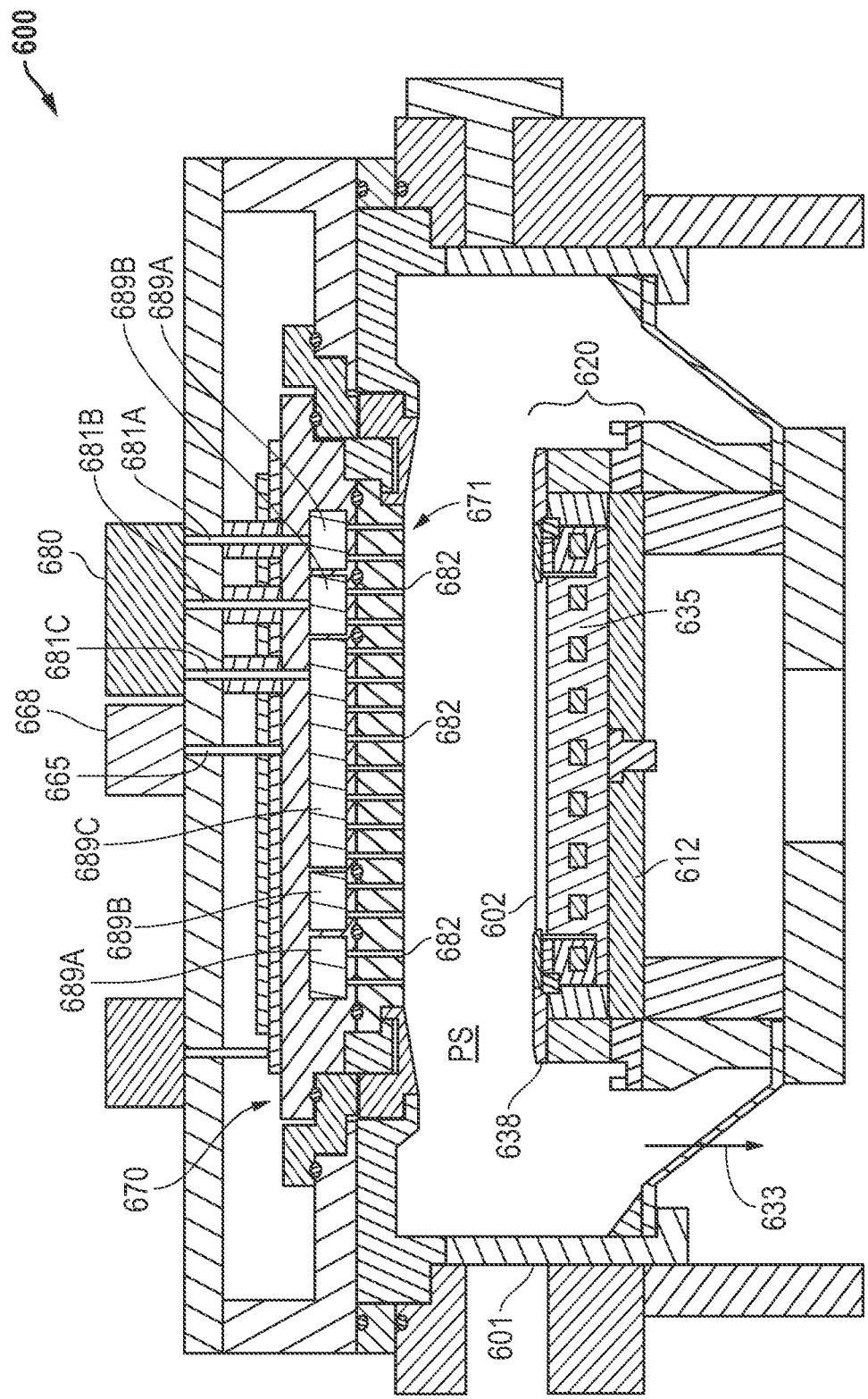
FIG. 6 is a block diagram of an example embodiment for a workpiece manufacturing system, such as a plasma processing apparatus, that can be used as an etch chamber for the embodiments described herein.

An embodiment 600 for an example plasma etch processing system is described with respect to FIG. 6. It is noted, however, that the techniques described herein may be utilized with a wide range of etch processing systems, and the embodiment 600 is simply one example embodiment.

FIG. 6 is a block diagram of an example embodiment 600 for a workpiece manufacturing system, such as a plasma processing apparatus, that can be used as an etch chamber for the embodiments described herein. More particularly, FIG. 6 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 600 of FIG. 6, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 600 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 600 is well known, and the particular structure provided herein is merely exemplary. Plasma processing can be executed within processing chamber 601, which can be a vacuum chamber made of a metal such as aluminum or stainless steel. The processing chamber 601 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 601, a susceptor 612 (which can be disc-shaped) can serve as a mounting table on which, for example, a substrate 602 to be processed (such as a semiconductor wafer) can be mounted. Substrate 602 can be moved into the processing chamber 601 through a loading/unloading port and gate valve. Susceptor 612 forms part of a lower electrode assembly 620 as an example of a second electrode acting as a mounting table for mounting substrate 602 thereon. The susceptor 612 can be formed of, e.g., an aluminum alloy. Susceptor 612 is provided thereon with an electrostatic chuck (as part of the lower electrode assembly) for holding the substrate 602. The electrostatic chuck is provided with an electrode 635. Electrode 635 is electrically connected to direct current (DC) power source, not shown. The electrostatic chuck attracts the substrate 602 thereto via an electrostatic force generated when DC voltage from the DC power source is applied to the electrode 635. The susceptor 612 can be electrically connected with a high-frequency power source via a matching unit. For other embodiments and processing chambers, two or more power sources can be used and connected to electrode 635 and/or other electrodes within the processing chambers. This high-frequency power source (a second power source) can output a high-frequency voltage in a range from, for example, 2 MHz (megahertz) to 20 MHz. Applying high frequency bias power causes ions, in plasma generated in the processing chamber 601, to be attracted to substrate 602. A focus ring assembly 638 is provided on an upper surface of the susceptor 612 to surround the electrostatic chuck.

An exhaust path 633 can be formed through one or more exhaust ports (not shown) which connect to a gas exhaust unit. The gas exhaust unit can include a vacuum pump such as a turbo molecular pump configured to pump out the plasma processing space within the processing chamber 601 to a desired vacuum condition. The gas exhaust unit evacuates the inside of the processing chamber 601 thereby depressurizing the inner pressure thereof down to the desired degree of vacuum.

An upper electrode assembly 670 is an example of a first electrode and is positioned vertically above the lower electrode assembly 620 to face the lower electrode assembly 620 in parallel. The plasma generation space or process space (PS) is defined between the lower electrode assembly 620 and the upper electrode assembly 670. The upper electrode assembly 670 includes an inner upper electrode 671, having a disk shape, and an outer upper electrode which may be annular and surrounding a periphery of the inner upper electrode 671. The inner upper electrode 671 also functions as a processing gas inlet for injecting a specific amount of processing gas into the process space (PS) above substrate 602 mounted on the lower electrode assembly 620. The upper electrode assembly 670 thereby forms a showerhead. More specifically, the inner upper electrode 671 includes gas injection openings 682.

The upper electrode assembly 670 may include one or more buffer chamber(s) 689A, 689B, and 689C. The buffer chambers are used for diffusing process gas and can define a disk-shaped space. Processing gas from a process gas supply system 680 supplies gas to the upper electrode assembly 670. The process gas supply system 680 can be configured to supply a processing gas for performing specific processes, such as film-forming, etching, and the like, on the substrate 602. The process gas supply system 680 is connected to gas supply lines 681A, 681B, and 681C forming a processing gas supply path. The gas supply lines are connected to the buffer chambers of the inner upper electrode 671. The processing gas can then move from the buffer chambers to the gas injection openings 682 at a lower surface thereof. A flow rate of processing gas introduced into the buffer chambers 689A-C can be adjusted by, e.g., by using a mass flow controller. Further, the processing gas introduced is discharged from the gas injection openings 682 of the electrode plate (showerhead electrode) to the process space (PS). The inner upper electrode 671 functions in part to provide a showerhead electrode assembly.

As shown in FIG. 6, three buffer chambers 689A, 689B, and 689C are provided corresponding to edge buffer chamber 689A, middle buffer chamber 689B, and center buffer chamber 689C. Similarly, gas supply lines 681A, 681B, and 681C may be configured as edge gas supply line 681A, middle gas supply line 681B and center gas supply line 681C. The buffer chambers are provided in a manner corresponding to different localized regions of the substrate in this case edge, middle and center. As will be discussed more below, these regions may correspond to specific process plasma process conditions for localized regions of the substrate 602. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 680 is configured to split the gas flows to the various buffer chambers.

The upper electrode assembly 670 is electrically connected with a high-frequency power source (not shown) (first high-frequency power source) via a power feeder 665 and a matching unit 668. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 602 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
   delivering a substrate for a microelectronic workpiece into a plasma processing chamber, the substrate having a silicon nitride layer;
   exposing selected regions of the silicon nitride layer to hydrogen ions and/or radicals by forming a first plasma formed of a first plasma gas containing hydrogen and directing plural beams from the first plasma onto the selected regions of the silicon nitride layer to modify the selected regions with hydrogen ions and/or radicals in the plural beams to form modified selected regions of the silicon nitride layer; and
   after the exposing the selected regions to hydrogen ions and/or radicals, exposing the modified selected regions to a second plasma formed of a second plasma gas containing fluorine to remove the modified selected regions of the silicon nitride layer; and
   removing the substrate from the plasma processing chamber.

2. The method of claim 1, further including-repeatedly performing modifying of the selected regions of the silicon nitride layer and the removing the modified selected regions of the silicon nitride layer to form a patterned silicon nitride layer, and using the patterned silicon nitride layer as a hard mask to etch a layer below the patterned silicon nitride layer.

3. The method of claim 1, wherein the first plasma gas further comprises argon (Ar).

4. The method of claim 1, wherein the second plasma gas comprises oxygen ($O_2$) and nitrogen trifluoride ($NF_3$).

5. The method of claim 4, wherein the volumetric flow rate ratio of $O_2$ to $NF_3$ is at least one of a ratio greater than four such that $O_2/NF_3>4$ or a ratio between 2 and 5 such that $2 \leq O_2/NF_3 \leq 5$.

6. The method of claim 5, wherein the first plasma gas consists of hydrogen and argon, and the second plasma gas consists of nitrogen trifluoride, oxygen and argon.

7. The method of claim 1, further comprising:
   igniting the first plasma gas within the processing chamber to generate the first plasma including hydrogen ions;
   igniting the second plasma gas within the processing chamber to generate the second plasma including fluorine ions.

8. The method of claim 1, further comprising:
   igniting the first plasma gas within the processing chamber to generate the first plasma including hydrogen ions;
   delivering the hydrogen ions to the silicon nitride layer in plural beams to form the modified selected regions of the silicon nitride layer;
   igniting the second plasma gas within the processing chamber to generate the second plasma including fluorine ions; and
   delivering the fluorine ions in one or more neutral beams to the silicon nitride layer to remove the modified selected regions of the silicon nitride layer.

9. The method of claim 8, further comprising passing the fluorine ions through a grid to form the one or more neutral beams.

10. The method of claim 1, further comprising:
    igniting the first plasma gas within the processing chamber to generate the first plasma including hydrogen ions;
    delivering the hydrogen ions in plural neutral beams to the silicon nitride layer to form the modified selected regions of the silicon nitride layer;
    igniting the second plasma gas within the processing chamber to generate the second plasma including fluorine ions; and
    delivering the fluorine ions in one or more neutral beams to the silicon nitride layer to remove the modified selected regions of the silicon nitride layer.

11. The method of claim 10, further comprising passing the hydrogen ions through a grid to form the one or more neutral beams and passing the fluorine ions through a grid to form the one or more neutral beams.

12. The method of claim 1, wherein the substrate further comprises at least one of a silicon layer or a silicon oxide layer below the silicon nitride layer.

13. The method of claim 1, wherein the first plasma comprises hydrogen ions to provide anisotropic etching of the silicon nitride layer.

14. The method of claim 1, wherein the first plasma comprises hydrogen radicals to provide isotropic etching of the silicon nitride layer.

15. The method of claim 1, wherein the forming of the modified selected regions of the silicon nitride layer, and removal of the modified selected regions of the silicon nitride layer are performed without using a mask above the silicon nitride layer.

16. The method of claim 15, wherein the first plasma gas consists of hydrogen and argon, and the second plasma gas consists of nitrogen trifluoride, oxygen and argon.

17. The method of claim 16, further including repeatedly performing modifying of the selected regions of the silicon nitride layer and removing the modified selected regions of the silicon nitride layer to form a patterned silicon nitride layer, and using the patterned silicon nitride layer as a hard mask to etch a layer below the patterned silicon nitride layer.

18. The method of claim 17, further comprising:
igniting the first plasma gas within the processing chamber to generate the first plasma including hydrogen ions;
delivering the hydrogen ions in plural beams to the silicon nitride layer to form the modified selected regions of the silicon nitride layer;
igniting the second plasma gas within the processing chamber to generate the second plasma including fluorine ions; and
delivering the fluorine ions in one or more neutral beams to the silicon nitride layer to remove the modified selected regions of the silicon nitride layer.

19. The method of claim 18, further comprising passing the fluorine ions through a grid to form the one or more neutral beams.

20. The method of claim 17, further comprising:
igniting the first plasma gas within the processing chamber to generate the first plasma including hydrogen ions;
delivering the hydrogen ions in plural neutral beams to the silicon nitride layer to form the modified selected regions of the silicon nitride layer;
igniting the second plasma gas within the processing chamber to generate the second plasma including fluorine ions; and
delivering the fluorine ions in one or more neutral beams to the silicon nitride layer to remove the modified selected regions of the silicon nitride layer.

21. The method of claim 1, wherein the first plasma gas consists of hydrogen and argon, and the second plasma gas consists of nitrogen trifluoride, oxygen and argon.

* * * * *